United States Patent [19]

Menigaux et al.

[11] Patent Number: 5,190,883
[45] Date of Patent: Mar. 2, 1993

[54] METHOD FOR MAKING AN INTEGRATED LIGHT GUIDE DETECTOR STRUCTURE MADE OF A SEMICONDUCTIVE MATERIAL

[75] Inventors: Louis Menigaux, Bures sur Yvett; Alain Carenco, Bourg La Reine; André Scavennec, Paris, all of France

[73] Assignee: France Telecom-Establissement autonome de droit Public (Centre National d'Études), France

[21] Appl. No.: 700,718

[22] Filed: May 16, 1991

[30] Foreign Application Priority Data

May 21, 1990 [FR] France ................. 90 06317

[51] Int. Cl.⁵ ............................................ H01L 31/18
[52] U.S. Cl. ................................ 437/3; 437/5; 148/DIG. 65; 372/45; 372/50
[58] Field of Search ............ 437/3, 4, 5, 129, 132, 437/126; 372/43, 45, 46, 50; 148/DIG. 56, DIG. 65, DIG. 66

[56] References Cited

U.S. PATENT DOCUMENTS

| | | | |
|---|---|---|---|
| 4,692,207 | 9/1987 | Bouadma et al. | 372/50 |
| 4,701,008 | 10/1987 | Richard et al. | 437/5 |
| 4,803,692 | 2/1989 | Sakano et al. | 372/50 |
| 4,811,352 | 3/1989 | Suzuki et al. | 372/50 |
| 4,813,051 | 3/1989 | Taneya et al. | 372/50 |
| 4,944,838 | 7/1990 | Koch et al. | 437/126 |
| 5,007,694 | 4/1991 | Yamamoto et al. | 372/50 |
| 5,115,283 | 5/1992 | Blondeau et al. | 372/45 |

FOREIGN PATENT DOCUMENTS 0110986 4/1990 Japan .................. 372/45

OTHER PUBLICATIONS

Calculation of the Maximum Optical Coupling Efficiency into Multimode Optical Waveguides; Marshall C. Hudson; Applied Optics; vol. 13, No. 5, May 5, 1974; pp. 1029-1033.
"Butt Coupled Photodiodes Integrated with Y-Branched Optical Waveguides on InP", W. Doldissen et al., ELECTRONICS LETTERS, Jan. 5, 1989, vol. 25, No. 1, pp. 35-37.
"Monolithic Integrated Waveguide Photodetector", S. Chandrasekhar et al., ELECTRONICS LETTERS, May 7, 1987, vol. 23, No. 10, pp. 501-502.
"Waveguide-Intergrated Pin Photodiode on InP", C. Bornholdt et al., ELECTRONICS LETTERS, Jan. 2, 1987, vol. 23, No. 1, pp. 2-4.
"Monolithic Integration of Short Length Photodetector with Optical Waveguide", J. F. Vinchant et al., 5TH EUROPEAN CONFERENCE ON INTEGRATED OPTICS; ECIO 89 Apr. 26-28, 1989, SPIE vol. 1141, pp. 14-18.

(List continued on next page.)

Primary Examiner—Brian E. Hearn
Assistant Examiner—Michael Trinh
Attorney, Agent, or Firm—Finnegan, Henderson, Farabow, Garrett & Dunner

[57] ABSTRACT

Method for making an integrated guide/detector structure made of a semiconductive material. This method consists of epitaxially growing on a semiconductor (2, 1) a lower confinement semiconductive film (4), a semiconductive guide film (6) and an upper semiconductive confinement film (8) with the same type of conductivity, the guide film being inserted between the confinement films having a prohibited band of energy smaller than that of the confinement films, of etching the upper film so as to form a guide strip with one extremity defining a first step (12) ending by a lateral broadening (28a) inside a plane parallel to the epitaxial films, of etching the released guide film so as to form a second step (16) adjacent to the first step, of epitaxially growing a semiconductive detector film (18) with this type of conductivity whose prohibited band of energy is smaller than that of the confinement films and the guide film, of eliminating that portion of the detective film covering the guide strip, and of forming the detector in the detecting film opposite the steps so as to embody a butt coupling between the guide film and the detector.

11 Claims, 3 Drawing Sheets

OTHER PUBLICATIONS

"Integrated Optical Photodetector", D. B. Ostrowsky, Apply. Phys. Lett., vol. 22, No. 9, May 1, 1973, p. 463.

"An Integrated Photoconductive Detector and Waveguide Structure", J. C. Gammel & J. M. Ballantyne, Appl. Phys. Lett. 36(2), Jan. 15 1980 pp. 149-151.

"Monolithic InGaAs Photodiode Array Illuminated Through an Integrated Waveguide", R. Trommer, Electronic Letters, vol. 21, No. 9, Apr. 1985, pp. 382-383.

"Integrated Waveguide p-i-n Photodetector by MOVPE Regrowth", S. Chandrasekhar et al. IEEE Electron Device Letters, vol. EDL-8, No. 11, Nov. 1987, pp. 512-514.

METHOD FOR MAKING AN INTEGRATED LIGHT GUIDE DETECTOR STRUCTURE MADE OF A SEMICONDUCTIVE MATERIAL

FIELD OF THE INVENTION

The present invention concerns a method to embody an integrated monolithic guide-photodetector or guide photoconductor structure made of a semiconductive material.

BACKGROUND OF THE INVENTION

This structure is able to be used mainly in telemetric and optical telecommunications applications.

Integration eliminates the defects of hybrid circuits; for example, in an optical fiber hybrid circuit, it is difficult to adjust optical access paths with a pair of equilibrated photodiodes of more than 1 mm for flowrates exceeding 600 mega binary elements per second, these paths being required for coherent heterodyne or homodyne reception.

The first integrated monolithic guide photodetector structures were made of silicon. In this technique, the light guides are made of a dielectric material, generally deposited on SiO2 and detection is ensured by a diode embodied in the substrate. Such a structure is described in the document by D. B. Ostrowsky and al and entitled "Integrated optical photodetector", Appl. Phys. Lett., vol. 22, No 9, May 1973, p. 463.

This solution is unable to be transposed to semiconductive structures made of III-V or II-VI materials since the semiconductive material guides have the same ranges of absorption, and thus transparence, as the substrate.

In this technology, a mixed guide photoconductor structure containing dielectric films and III-V material is described in the document by J. C. Gammel and J. M. Ballantyne and entitled "An integrated photoconductive detector and waveguide structure", Appl. Phys. Lett. 36 (2), January 1980, p. 149. In this structure, the optical guides are still made of a dielectric material and not of a semiconductive material.

The article by R. Trommer entitled "Monolithic InGaAs photodiode array illuminated through an integrated waveguide", Electronic Letters, vol. 21, No 9, April 1985, p.82, refers to the first photodetector integrated with a III-V material-based optical guide. This integrated structure has a certain number of drawbacks.

In particular, the embodiment of this structure requires two epitaxial growths, one on the front face and one of the rear face, this embodiment thus proving to be a complex one. The luminous beam to be detected traverses a thick film of InP n+ (about 200 micrometers) which attenuates one portion of the beam due to the absorption of the latter by the free carriers. Finally, a rear V-shaped section needs to be made to coincide with the front photodetector opposite, which presents significant embodiment difficulties.

A certain number of integrated guide photodetector structures made of III-V material via the coupling by dying out waves has been envisaged (see, for example, the article by C. Bornholdt and al and entitled "Waveguide-integrated p-i-n photodiode on InP", Electronic Letters, vol. 23, No 1, January 1987, p.2 or the article by S. Chandrasekhar and al and entitled "Monolithic integrated waveguide photodetector", Electronic Letters, vol. 39, No 10, May 1987, p. 501).

In the current state of embodiments, the coupling lengths need to be considerable, that is several hundreds of micrometers, so as to have the photodetector zone carry out absorbtions exceeding 90%. It follows that the dimensions of the photodiodes be large, hence resulting in large impedances and reduced response speeds, as well as higher dark currents.

Various integrated guide photodetector structures made of III-V material with butt coupling have been envisaged (see the document by S. Chandrasekhar and al and entitled "Integrated waveguide p-i-n photodetector by MOVPE regrowth", IEEE Electron device letters, vol. EDL-8, No 11, November 1987, p. 512). In this type of structure, the diffusion area p of the diode p-i-n needs to be localized with a large amount of precision with respect to the extremity of the optical guide (precision less than 1 micrometer). This represents the major problem posed by butt coupling.

In addition, one portion of the light to be detected may pass outside the absorbant film and thus reduce detection efficiency. In addition, the structure is not planar; as a result, diffusion p on the mesa results in a squeezing of the intrinsic zone at the level of the guide and thus a risk of the diode breaking down.

In the article by W. Döldissen and al ("Butt coupled photodiodes integrated with Y-branched optical waveguides on InP", Electronic Letters vol.25, No 1, Jan. 1989, p.35), the butt-detection of light is ensured by a diode obtained by a diffusion p+ above the guide film, the surface of the diode then being delimited via chemical attack in mesa form. The exposed junction is then rendered passive by a suitable nonconductor. This technique has never been the best technology for the time-behaviour of the diffused diode. According to the inventors, a planar diode obtained by the localized diffusion of the doper p in a film n does not improve the situation.

SUMMARY OF THE INVENTION

The object of the invention is to provide a method for embodying an integrated guide photodetector or guide photoconductor structure made of a semiconductive material so as to overcome the various drawbacks mentioned above. In particular, this method is much simpler to implement than those of the prior art and makes it possible to increase detection efficiency; it further offers the possibility of using larger incident optical powers.

In the rest of the description, the word "detector" shall signify either a photodetector (such as a p-i-n diode or a Schottky diode) or a photoconductor.

In the structure obtained according to the invention, the coupling of the guide and detector is ensured via the end and the method of the invention makes it possible to dispose of the accuracy constraints linked to localization of the detector with respect to the extremity of the guide.

In addition, the method makes it possible to embody the detector as far as possible from the interfaces between the absorbant zones transparent to light, thus limiting any losses of luminous information.

More specifically, the object of the invention is to provide a method for embodying an integrated monolithic guide detector structure consisting of:

a) epitaxial growing on a semiconductive material a lower confinement semiconductive film, then a semiconductive guide film and finally an upper semiconductive confinement film, the guide film being inserted between those confinement films having a prohibited band of energy smaller than that of said confinement films, these films having the same type of conductivity, b) etching the upper confinement film so as to form a strip guide with one of its extremities defining a first step, c) etching the guide film freed at b so as to form a second step adjacent to the first step, d) epitaxially growing a semiconductive detector film with this type of conductivty on the structure obtained at c), the prohibited band of energy of this detector film being smaller than that of the confinement and guide films, e) eliminating that portion of the detector film covering the strip guide, and f) forming the detector in said detector film opposite said steps so as to embody a butt coupling between the guide film and the detector.

By virtue of the stair head or second step of the guide film, the detection portion is no longer localized with as much precision as in the prior art, since the detector may then be horseback-mounted on the extremity of the guide film.

According to the invention, the detection may be a photodetection or a photoconduction; depending on the case, the detecting film is either designated as a photodetector film or a photoconductive film.

Photodetection is carried out by diffusing in the detector film impurities with a conductivity differing from the one constituting the epitaxial grown films so as to constitute a junction point p-i-n. In addition, an ohmic contact is provided on the zones n and p.

The local diffusion of these ions in the planar photodetector film makes it possible to resolve the problem of protecting the diode, as shown in the aforesaid article by Döldissen.

When the detector is a photodetector, the diffusion of ions and the ohmic contacts are replaced by the depositing of two conductive electrodes on the detector film spaced from each other and disposed opposite the steps on both sides of the strip guide; these two electrodes are parallel to the direction of propagation of the light in the strip guide.

In the integrated structure obtained, the light is guided in the guide film and then opens into the detector film so as to be absorbed by the latter, which provokes the conversion of the photons into electron/hole pairs in the detector film situated at the outlet of the strip guide under the diffused zone or the electrodes. This results in a photocurrent in the diode p-i-n or a resistance variation at the terminals of the electrodes of the photoconductor.

The distance separating the vertical flanks of the first and second steps needs to to be relatively short so that the absorption of light by dying waves in the detector film is negligible.

Advantageously, this distance is greater than or equal to 5 μm and less than 10 μm and, for example, equal to 8 μm.

The strip guide is relatively narrow, usually between 2 and 6 μm. Now, the use of light guides, also narrow in photodetection or photoconduction, means that the density of energy at the level of the photodetector or photoconductor is extremely high. For a guide section, normally of 5 μm2 at intensity mid-height, a luminous power of 1 mW entering into the detector corresponds to about 20 kW/cm2. (The local oscillator used in a heterodyne detector effectively has an optical power of several mW).

The density of the photoelectrons is therefore extremely high and results at the level of the detector in a degeneracy of the electric field existing in the space charge load of the diffused zone or of the zone situated under the electrodes, depending on whether the detector is a photodetector or a photoconductor. In this respect, consult the article by J. E. Viallet and al and entitled "Photodiode for coherent detection: modeling and experimental results", Journal de Physique, Colloque C4, supplement to No 9, vol 49, September 1988, p.321.

This results in firstly a poor collection of carriers and thus a drop of photoelectric efficiency, and secondly an increase of the capacity of the photodiode or photoconductor resulting in a much slower response speed of the detector.

The invention proposes to resolve this problem by allowing the light beam to spread freely via diffraction inside the plane of the epitaxially grown films so as to arrive at the width of the diode or the inter-electrode space, the guidance inside the plane perpendicular to the films being retained.

To this effect, the strip guide ends at its extremity opposite the detector by laterally widening inside a plane parallel to the epitaxially grown films. Thus, the density of energy is reduced at the level of the detector.

The method of the invention is applicable to any type of semiconductive material, such as II-VI materials including the HgCdTe family and to any type of III-V semiconductors.

The method of the invention is completely adapted to III-V compounds. In this case, the confinement films, the guide film and the detector film are advantageously not intentionally doped so as to limit any luminous absorption phenomena, residual doping generally being of the n— type due to the greater mobility of the majority carriers.

According to one first embodiment, the substrate is an InP substrate, type n+, the confinement films are InP films, type n—, the guide film is made of $Ga_xIn_{1-x}As_yP_{1-y}$, type n— with $0<x\leq1$ and $0\leq y<1$ and the detector film is made of $Ga_{1-z}In_zAs$, type n—, with $0\leq z\leq1$.

According to a second embodiment, the substrate is made of GaAs, type n+, the confinement films being $Ga_{1-t}Al_tAs$, type n—, with $0<t\leq1$, the guide film is a GaAs film, type n—, and the detector film is a $Ga_{1-v}In_vAs$ film, type n—, with $0<v\leq1$.

BRIEF DESCRIPTION OF THE DRAWINGS

Other characteristics and advantages of the invention shall appear more readily from a reading of the following description, given by way of illustration and being non-restrictive, with reference to the accompanying drawings on which:

FIGS. 1, 2A, 3, 4 and 5A are longitudinal cutaway views and FIGS. 2B and 5B are top views;

FIG. 2C is a longitudinal cutaway view and FIGS. 6 and 7 are top views;

DETAILED DESCRIPTION OF THE PREFERRED EMBODIMENTS

As the method of the invention is completely adapted to III-V materials, the following description shall solely relate to these materials.

Figure 1:
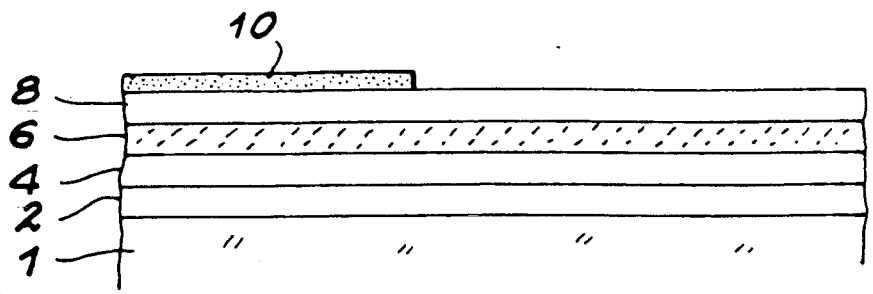
FIGS. 1, 2A, 2B, 3, 4, 5A and 5B diagramatically illustrate the various stages for embodying a photoconductor guide conforming to the invention.

First of all, the method of the invention comprises, as shown on FIG. 1, an epitaxial growth of the various III-V material semiconductive films on a III-V material monocrystalline substrate; these epitaxial growths are embodied indistinctly according to known MOCVD, LPE or EJM techniques.

The substrate 1 is a binary InP or GaAs substrate rendered semi-nonconducting by a chromium doping for GaAs and an iron doping for InP.

Firstly, a buffer semiconductive film 2 having the same composition as the substrate is epitaxially grown on the substrate 1 and doped n+ with silicon at a dose of $10^{18}$ at/cm3 and being about 1 μm thick, followed by a lower confinement semiconductive film 4 of III-V non-doped material about 1 μm thick, and then a semiconductive non-doped guide film 6 of III-V material about 1 μm thick, and finally an upper confinement semiconductive non-doped film 8 of III-V material about 1 μm thick.

The thicknesses of the films are selected more specifically according to the exact compositions of the materials and the desired optical confinement percentage.

For a substrate 1 and a GaAs buffer film, the confinement films 4 and 8 are made of Ga1-t Alt As with t selected within the interval ranging from 0.01 to 0.40 and the guide film 6 is made of GaAs. For a substrate 1 and an InP buffer film 2, the confinement films 4 and 8 are made of InP and the guide film is made of $Ga_xIn_{1-x}As_yP_{1-y}$ with the following relation between x and y:

$$x = 0.1894y/(0.4184 - 0.013y)$$

so as to ensure InP mesh tuning. In addition, it is reasonable to have x and y vary within a range where the prohibited band energy of this quaternary material defined by the equation:

$$Eg(eV) = 1.35 - 0.72y + 0.12y2$$

is situated between 1.25 eV (or 1 μm) and 0.85 eV (or 1.45 μm), that is between firstly the pairs of values x=0.06 and y=0.14 and secondly x=0.37 and y=0.80.

By means of a conventional photoetching technique (CVD depositing, resin photomask, chemical etching, elimination of the photomask), a silicon nitride mask 10 (Si3N4) is embodied masking the region of the confinement film 8 to be retained.

Figure 2A:
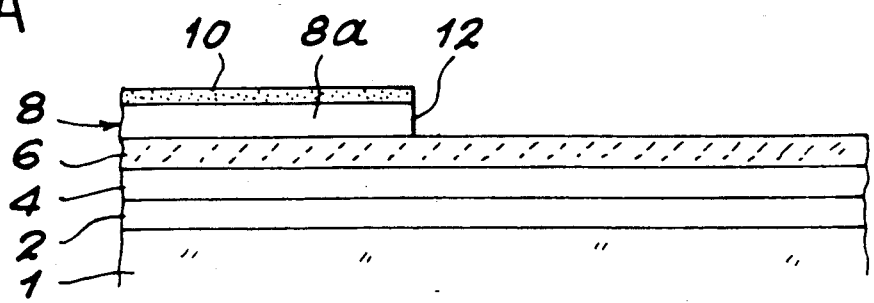
Figure 2B:
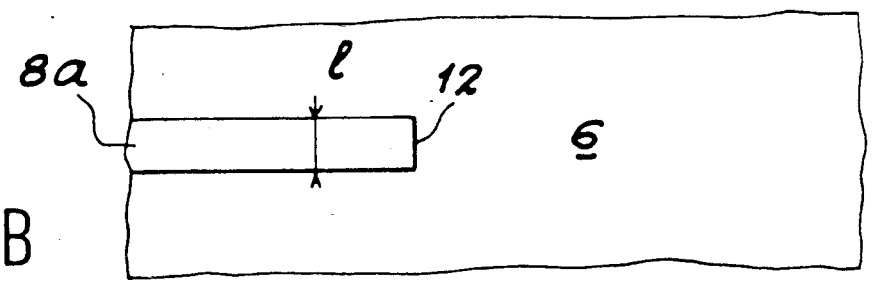

By means of selective attack, the film 8 is etched, the nitride 10 used to mask this etching, thus transferring the shape of the mask 10 into the film 8, as shown on FIGS. 2A and 2B. This etching may be embodied by ionic maching with argon ions or via a humid process with a mixture of HCl/H3PO4 in the volume proportion of 1:1 for an InP film 8 and with H2SO4/H2O2/H2O in a volume proportion of 1:8:1 for a GaAlAs film 8.

The mask 10 appears in the form of a strip with a given width 1 extending over only one portion of the film 8; it thus makes it possible to obtain a strip guide 8a with the width 1, typically 4 micrometers (FIG. 2B), its extremity forming a step 12 with the film 6.

Figure 2C:
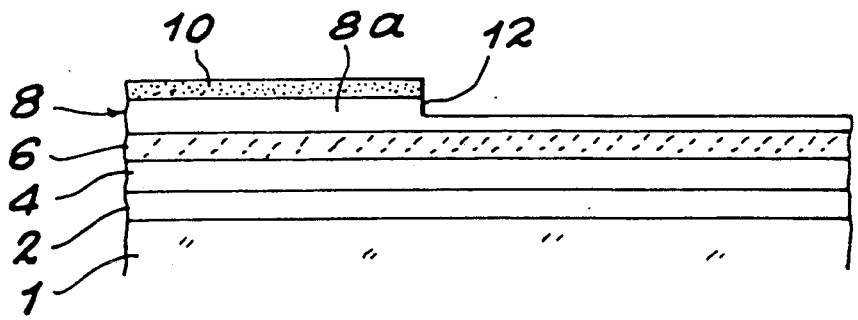
FIGS. 2C, 6 and 7 are embodiment variants of an integrated photodetector guide structure conforming to the invention.

The etching of the film 8 may be effected over its entire thickness, as shown on FIG. 2A, or even solely on one portion of the thickness of the film, as shown on FIG. 2C.

Then the etching mask 10 is dry-process eliminated with a CF4 plasma.

Figure 3:
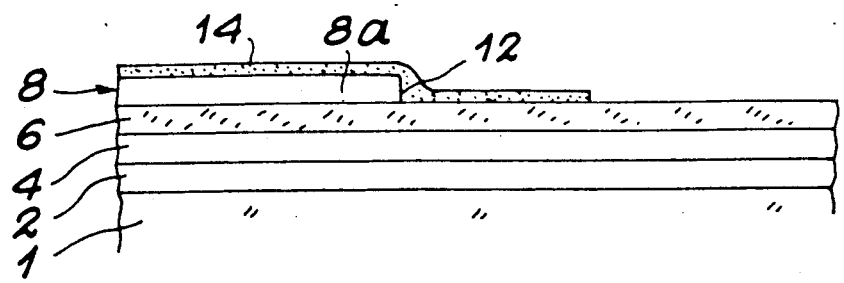

The next stage of the method shown on FIG. 3 consists of forming a new silicon nitride mask 14 intended to mask the entire strip guide 8a, as well as the zones of the film 6 to be retained. This mask 14 masks the zone of the film 6 adjacent to the step 12 situated at the end of the latter.

Then a selective etching is made of the film 6 over its entire thickness. The structure obtained is the one shown on FIG. 4. The etched film 6 defines, along with the film 4, a step 16 adjacent to the step 12 so as to constitute a stair with two steps.

For a GaInAsP film 6, the selective attack may be effected with a solution of H2SO4/H2O2/H2O in the volume proportions of 1:10:1 and, for a GaAs guide film, etching may be effected with CH4O/H2O2/H3PO4 in a volume proportion of 3:1:3.

The distance d separating the two steps is about 8 micrometers.

After elimination of the etching mask 14, in accordance with the same conditions as with the mask 10, a doped photoconductive semiconductive III-V material film 18 is epitaxially grown. This film is thicker than the stacking of the films 8 and 6 and has a thickness of between 2 and 5 micrometers.

This film 18 is made of Ga1-z Inz As, type n− ($<10^{16}$ cm$^{-3}$) with z=0.47, which corresponds to a prohibited band energy of 0.75 eV (or 1.65 μm) for an InP or GaAs substrate.

A new mask of silicon nitride 20 is formed whose opening is made above the steps 12 and 16, the extremity of the step 16 possibly being masked. The positioning of the mask is not strictly important.

Then a selective etching is made of the photoconductive film 18 so as to eliminate from it the non-masked portions of the latter. The structure obtained is the one shown on FIG. 5A. This etching is embodied by a solution of H2SO4/H2O2/H2O in the volume proportion of 1:10:1.

Then the etching mask 20 is eliminated, as described previously.

Then two electrodes 24 and 26 are deposited on the photoconductive film 18 by means of the "lift off" technique, well-known by experts in this field.

Figure 5A:
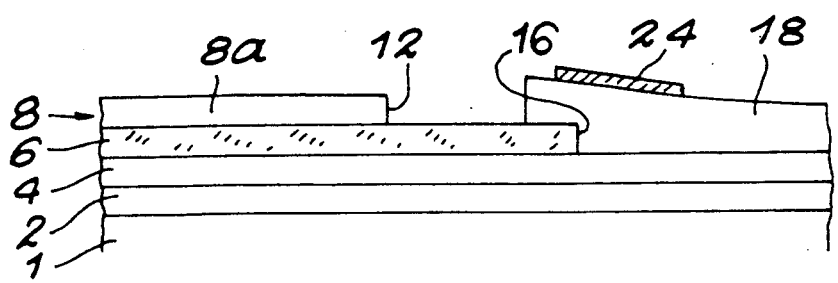
Figure 5B:
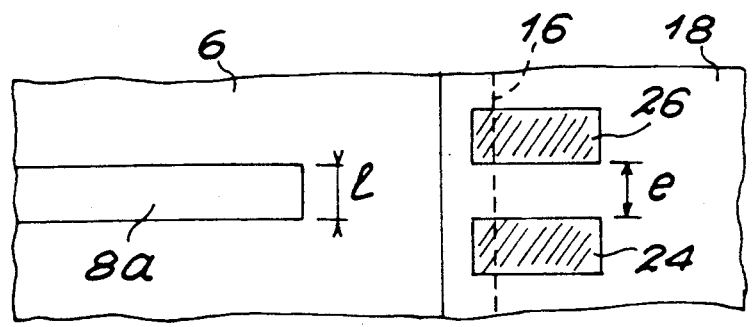

As shown on FIG. 5B, the electrodes 24 and 26 are deposited in the projection of the strip guide 8a and disposed symmetrically on both sides of the latter; they are orientated parallel to the longitudinal axis of the strip guide 8a. These electrodes may be horseback-mounted on the step 16.

The distance e separating the two electrodes is close to the width 1 of the strip guide 8a.

Figure 6:
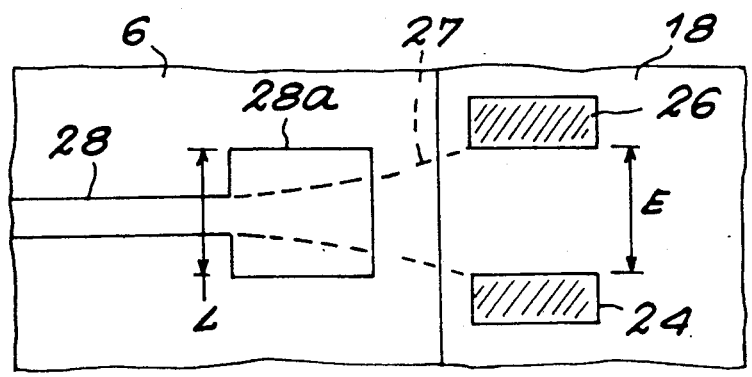
Figure 7:
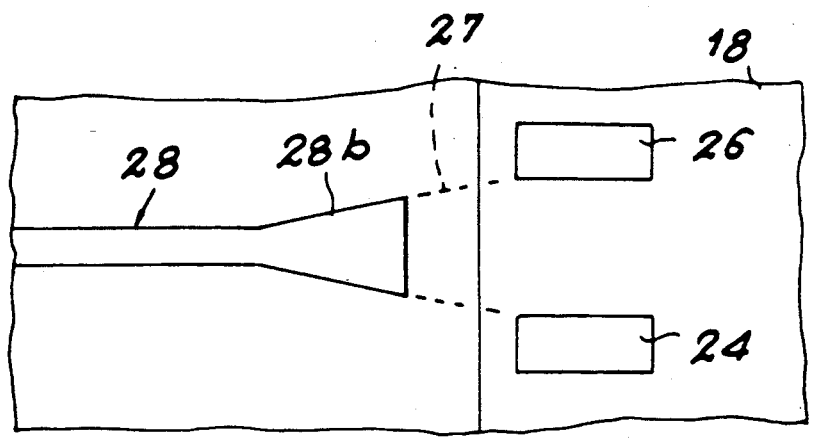

One way of increasing the detectable incident optical power with photoelectric efficiency, as well as the optimum response speed, is to allow the light beam 27 to spread freely via diffraction inside the plane of the epitaxially grown films, as shown on FIGS. 6 and 7.

To this efect, the strip guide 28 defined in the film 8 is ended at its extremity opposite the electrodes 24 and 26 by a lateral widening 28a or 28b inside a plane parallel to the epitaxial grown films, the guidance inside the plane perpendicular to the films being retained.

This widened portion may have the shape of a parallelpipedic rectangle 28a, as shown on FIG. 6, or even the shape of a truncated cone 28b, as shown on FIG. 7, or any other adiabatic shape (such as parabolic). These particular configurations of the strip guide are obtained during the selective etching of the film 8 by using a suitably-shaped etching mask.

In the configuration of FIG. 6, the distance E separating the electrodes 24 and 26 is equal to the width l of the widened portion 28a measured along a direction perpendicular to the projection of the beam 27.

Figure 8:
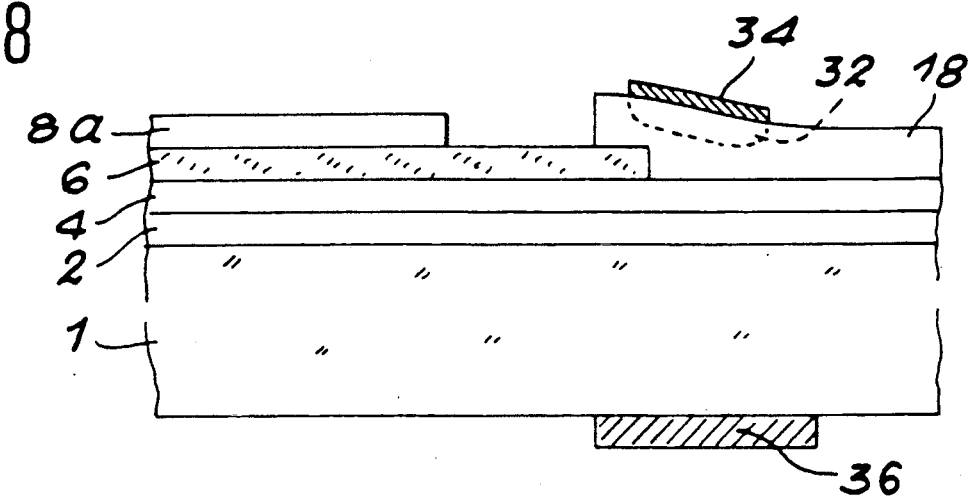
FIG. 8 shows a longitudinal cutaway view of the embodiment of an integrated photodetector guide structure p-i-n conforming to the invention.

The detector portion of the integrated structure of the invention may also consist of one photodetector, as shown on FIG. 8. This structure merely differs from the previous structure by virtue of the detection portion. This portion consists of replacing the two electrodes 24 and 26 by a diffused zone 32 with conductivity acting in a opposite direction to that of the detector film 18 and in particular a diffused zone p+. This diffused zone 32 is horseback situated on the step 16 of the guide film.

This diffusion is effected through a silicon nitride mask whose opening is situated plumb with the step 16. This opening has a diameter of about 30 micrometers. A localized diffusion of ZnAS2 in a sealed bulb is effected in the following conditions: 2 hours at 500° C. for a joining depth of about 1.5 micrometers.

Figure 4:
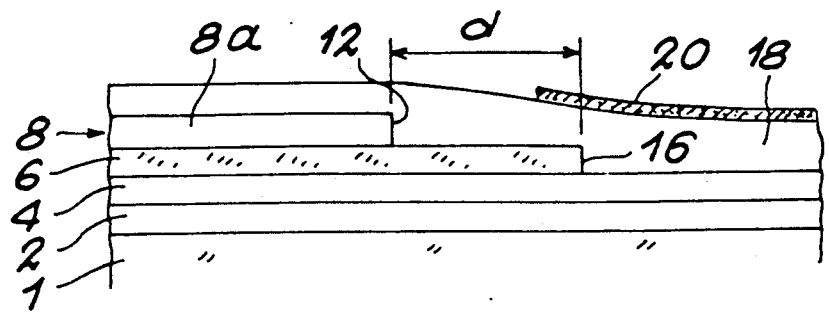

This diffusion p+ is embodied before elminiating the portion of the film 18 situated above the guiding portion of the structure (FIGS. 4 and 5A).

Ohmic contacts 34 and 36 are embodied on the zones p+ and n+ respectively of the diode. These contacts are AuZn and AuGeNi contacts respectively.

The strip guide of this photodetector guide structure may of course comprise one widened portion, as shown on FIGS. 6 and 7, the width L of the widened portion roughly equalling the diameter of the diode, namely 30 micrometers.

The embodiment of the photodiode or photoconductor as far as possible from the growth interfaces of the film 18 makes it possible to limit any losses of luminous information and thus increase the efficiency of the photodiode or photoconductor. In fact, the growth interfaces constitute traps for those electrons generated by illumination.

Figure 9:
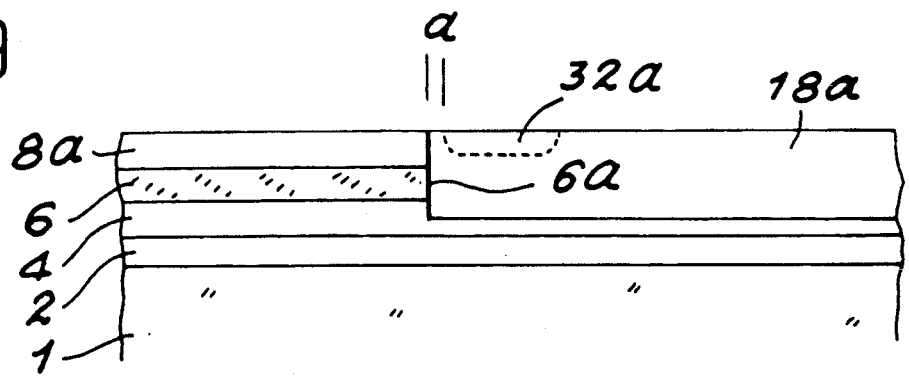
FIG. 9 shows a longitudinal cutaway view of the embodiment of an integrated photodetector guide structure not forming part of the invention, this figure showing the practical difficulties of a butt coupling without the embodiment of a step in the guide film.

In the butt coupling of a guide and a photodetector, the junction point pn needs to be situated flush with the limit of the guide, as shown on FIG. 9; the distance a separating the extremity 6a of the guide and the diffused zone 32 of the junction may vary between 1 and several micrometers, depending on the absorbant quality of the photodetector material 18a. Now, it is extremely difficult in practice to reduce the distance a to the maximum.

With the notion of the stair head 16 on the guide film, in accordance with the invention, the detection portion and in particular the diffused zone 32 or the electrodes 24 and 26 do not need to be accurately localized.

What is claimed is:

1. Method for making an integrated monolithic detector guide structure consisting of the stages:
  a) epitaxially growing on a semiconductive material a lower semiconductive confinement film followed by a semiconductive guide film and finally an upper semiconductive confinement film, the guide film being inserted between the confinement films having a prohibited band of energy smaller than those of said confinement films, all said films having a first conductivity type,
  b) etching the upper confinement film so as to form a strip guide with one extremity defining a first step,
  c) etching the guide film to form a second step adjacent to the first step so as to constitute a stair with two steps
  d) epitaxially growing a semiconductive detector film with the first conductivity type on the films obtained at the stage c), a prohibited band of energy of this detector film being smaller than those of the confinement and guide films,
  e) eliminating that portion of the detector film covering the strip guide, and
  f) forming a detector in said detector film opposite said second step so as to embody a butt coupling between the guide film and the detector.

2. Method according to claim 1, wherein the etching of the upper confinement film is embodied solely on one portion of its thickness so that the remaining portion of the upper film is on the second step.

3. Method according to claim 1, wherein the strip guide ends at said extremity by a lateral widening inside a plane parallel to the epitaxially grown films.

4. Method according to claim 1, wherein the stage f, consists of forming two conductive electrodes on the detector film spaced from each other and disposed opposite the steps on both sides of the strip guide and parallel to the strip guide.

5. Method according to claim 1, wherein the stage f, consists of locally diffusing impurities having a second conductivity type differing from the first conductivity type of the semiconductive film so as to form opposite the steps a pn junction and forming an ohmic contact on each side of the pn junction.

6. Method according to claim 1, wherein a distance between vertical flanks of the first and second steps is selected in an interval ranging from 5 to 10 micrometers.

7. Method according to claim 1, wherein the semiconductive material supporting the epitaxially grown films is constituted by a semi-nonconductive substrate, on which a highly doped semiconductive film has been epitaxially grown, being of the same semiconductive material as the upper and lower confinement films, the guide film and the detector film.

8. Method according to claim 1, wherein the semiconductive material and the semiconductive films are constituted by III-V compounds.

9. Method according to claim 7, wherein the confinement films, the guide film and the detector film are not intentionally doped.

10. Method according to claim 7, wherein the substrate is an InP substrate, type n+, the confinement films are InP films, type n−, the guide film is a $Ga_xIn_{1-x}As_yP_{1-y}$ film, type n−, with $0 < x \leq 1$ and $0 \leq y < 1$, and the detector film is a $Ga_{1-z}In_zAs$ film, type n−, with $0 \leq z \leq 1$.

11. Method according to claim 7, wherein the substrate is a GaAs substrate, type n+, the confinement films are $Ga_{1-t}Al_tAs$ films, type n−, with $0 < t \leq 1$, the guide film is a GaAs film, type n−, and the detector film is a $Ga_{1-v}In_vAs$ film, type n−, with $0 < v \leq 1$.

* * * * *